United States Patent [19]

Poujois

[11] Patent Number: 4,676,761

[45] Date of Patent: Jun. 30, 1987

[54] PROCESS FOR PRODUCING A MATRIX OF ELECTRONIC COMPONENTS

[75] Inventor: Robert Poujois, Sinard, France

[73] Assignee: Commissariat a l'Energie Atomique, Paris, France

[21] Appl. No.: 910,324

[22] Filed: Sep. 22, 1986

Related U.S. Application Data

[63] Continuation of Ser. No. 664,473, Oct. 24, 1984, abandoned.

[30] Foreign Application Priority Data

Nov. 3, 1983 [FR] France .................. 83 17466

[51] Int. Cl.$^4$ .................. G01R 31/26; G01R 15; G01R 12
[52] U.S. Cl. .................. 445/3; 445/2; 324/158 R; 29/575; 29/574; 340/784
[58] Field of Search .................. 445/2, 3, 24; 29/574, 29/575; 340/784; 324/158 R

[56] References Cited

U.S. PATENT DOCUMENTS

| | | | |
|---|---|---|---|
| 3,631,411 | 12/1971 | Kosonocky | 340/173 LS |
| 3,707,767 | 1/1973 | Queurin | 29/574 |
| 3,861,023 | 1/1975 | Bennett | 29/575 |
| 4,053,833 | 10/1977 | Malmberg et al. | 324/158 R |
| 4,304,450 | 12/1981 | Bilsback | 445/2 |
| 4,368,523 | 1/1983 | Kawate | 29/575 |
| 4,405,921 | 9/1983 | Mukaiyama | 340/784 |
| 4,429,305 | 1/1984 | Hosokawa | 340/784 |

FOREIGN PATENT DOCUMENTS

| | | | |
|---|---|---|---|
| 0031143 | 7/1981 | European Pat. Off. | |
| 2316692 | 1/1977 | France | |
| 0176948 | 10/1983 | Japan | 29/575 |
| 0067645 | 4/1984 | Japan | 29/575 |

OTHER PUBLICATIONS

IEEE Journal of Solid-State Circuits (Jun. 1977).
Article in Elecktronische Rechenanlagen (Dec. 1969).

Primary Examiner—Nicholas P. Godici
Assistant Examiner—Kurt Rowan
Attorney, Agent, or Firm—Pearne, Gordon, McCoy & Granger

[57] ABSTRACT

Process for the production of a matrix of electronic components.

The matrix and the associated control circuits are produced in redundant form. The redundant elements can be interconnection lines between the electronic components of a matrix row or column and the associated control circuits or the actual electronic component. A row or column of electronic components represents a subassembly, which is tested by means of optical addressing, consisting of transmitting light rays onto photodiodes located at the periphery of the matrix and connected to each subassembly. As a function of the test result, the matrix is reconstituted by disconnecting the defective electronic components in the redundant subassemblies and then reconnecting the satisfactory subassemblies to one another. This process is more particularly applicable to a matrix of elements used for the control of a matrix display.

24 Claims, 15 Drawing Figures

PROCESS FOR PRODUCING A MATRIX OF ELECTRONIC COMPONENTS

This is a continuation, of application Ser. No. 664,473, filed on Oct. 24, 1984, abandoned.

BACKGROUND OF THE INVENTION

The present invention relates to a process for the production of a matrix of electronic components. It applies to any matrix-type arrangement of electronic components and particularly a matrix of elements used for controlling a liquid crystal or electroluminescent display screen, or optical detectors.

In a matrix of electronic components having m rows and n columns of components which are electrically interconnected, the excitation of a component ij located at the intersection of the row i, i being an integer such that $1 \leq i \leq m$, and column j, j being an integer such that $1 \leq j \leq n$, is carried out by simultaneously exciting (applying a voltage) row i and column j of components.

The selective control of this electronic component is only possible if the components have a sufficiently non-linear characteristic permitting multiplexing.

In the case of a liquid crystal matrix display, this characteristic is represented by the ratio of the voltage applied to the optical contrast on the screen.

Multiplexing in a matrix display is facilitated by the addition of a non-linear, electronic element (diode, transistor), arranged in series with the electrode of the elementary display point of the liquid crystal. The non-linear element makes it possible to introduce a threshold on the electrooptical characteristic of the effect used.

FIG. 1a diagrammatically shows in simplified manner, the organisation of a prior art, non-redundant, matrix display. The screen 1 of the display is formed by m rows and n columns of elementary display points 2 forming a matrix.

The video signal 3 is stored in capacitive samplers $4_1 \ldots 4_n$, which store one image row. The samplers are controlled by a shift register $5_j$ in which circulates a pulse controlling the successive sampling operation. The video information contained in the sampler is transferred into the row of the corresponding matrix, where the control transistors of the elementary display points are in the conductive state. These transistors are controlled by the row control registers $6_1 \ldots 6_n$. The shift registers $5_1 \ldots 5_n$ and the row control registers $6_1 \ldots 6_m$ are controlled by clock rows 7 and 8 respectively.

A row-by-row scanning is performed in order to reproduce the video signal of the display, in accordance with a conventional method used in television equipment.

FIG. 1b shows an elementary display point of a liquid crystal display.

Electrode 9 is located on the face of the display in contact with the liquid crystal. A transparent electrode covering the complete screen is located on the front face of the liquid crystal. This electrode is kept at a constant potential and can e.g. be connected to earth 11. The two electrodes form a capacitance 10, the liquid crystal being located between the two electrodes.

A transistor 12 is connected in series with electrode 9, its drain being connected to the interconnection line 14 of a column, its grid being connected to an interconnection line 13 of a row of display points. Transistor 12 is the non-linear element authorizing the multiplexing of the electrodes 9 forming the matrix.

In such a matrix of components, such as a matrix display, the presence of defects with respect to the electronic components, the interconnection lines between the components or in the circuits controlling the rows and columns of the matrix leads to overall operational disturbances.

The most harmful defects in a matrix are interruptions of the interconnection lines between the electronic components and short-circuits between the rows and columns. For example, these defects are due to over or underetching of the interconnection lines during the matrix production process, or to the presence of grains of dust on a mask during the photolithography stage during the production of the matrix.

It is also possible for short-circuits to occur at the control transistors in the electronic components. Defects solely relating to a single elementary display point in a matrix display can be accepted, if the point is sufficiently small to be invisible to the naked eye.

An interruption of an interconnection line between the electronic components of the matrix or a short-circuit, however, makes the row or the row and the column respectively inoperative. Thus, complete defective rows make the matrix unusable.

Hitherto, most of the matrix displays produced were too small for most applications, but too large for the matrix of electronic components to be produced with a good production efficiency.

The efficiency of a matrix is dependent on the number and type of defects which can be accepted. For example, in a matrix of $(240)^2$ components and accepting defective rows, columns and elementary display points, the efficiency is approximately 50%, but such a circuit cannot be used. If only the defective elementary display points are accepted, the production efficiency decreases to 10%. The matrix is usable if the points are sufficiently small.

Without any defect, the efficiency can drop to 1% and can vary as a function of the technology used, but overall the results remain inadequate.

In order to obviate such problems and increase the production efficiency of these matrixes, it is possible to introduce a redundancy on several matrix levels.

Thus, it is possible to provide interconnection lines between the redundant electronic components, or there is a redundancy for each component, i.e. the number of components is increased.

Consequently, if one interconnection line is defective, it can be replaced by another formed by a redundant line, or in the second case it is possible to replace a defective component by another adjacent component.

The production of a matrix of redundant electronic components in accordance with the prior art consists of producing the components and the interconnections, then testing the continuity of the interconnection lines, bringing about a reconfiguration of the matrix by disconnecting the defective elements and reconnecting the satisfactory elements to one another and connecting the thus obtained matrix of electronic components to associated control circuits, which are located in the periphery of the matrix.

In order to be able to carry out the matrix operating test, all the redundant functions must be individually accessible during the test. The latter requires a large number of access hubs in the matrix.

This leads to an increase in the overall dimensions within the matrix, which is prejudicial to certain applications, e.g. in the case of a liquid crystal display. More-over, it is necessary to mechanically displace the test points, which makes the testing process long and difficult.

According to the prior art, following the testing of the matrix, the satisfactory rows and columns are connected to the associated control circuits, which do not have any redundancy. Thus, it is not possible to test both the satisfactory operation of the complete control circuitry and the matrix. These post-test connections can lead to a deterioration of the functions recognised as satisfactory during the test.

SUMMARY OF THE INVENTION

The object of the present invention is to propose a process for the production of a matrix of electronic components making it possible to obviate these disadvantages. In particular, it makes it possible to produce a smaller redundant matix, carry out the test more easily and rapidly by including the testing of the control circuitry, as well as increasing the matrix output rate.

More specifically, the present invention relates to a process for the production of a matrix of electronic components having m rows and n columns of electronic components and control circuits located at the periphery of the matrix, associated with each row and each column of components, wherein it comprises realising the matrix and the associated control circuits in redundant form, the redundant elements being subassemblies each constituted by a certain number of electronic components associated with their control circuits, each subassembly being realised in such a way that it can be tested at the matrix periphery; performing the test of each subassembly by means of an optical addressing consisting of transmitting light rays onto photodiodes located at the matrix periphery and connected to each subassembly, certain of these photodiodes being used for selecting the subassemblies to be tested and the other photodiodes being used to produce test signals by means of light rays in the same subassembly; said test being used to check, in each redundant subassembly, the continuity of the interconnection lines between the electronic components and the operation of the associated control circuit; reconstituting the matrix, as a function of the test result, by disconnecting within the redundant subassemblies the defective electronic components and reconnecting the satisfactory electronic components.

According to another feature, for each row of electronic components of the matrix, the interconnection lines of electronic components of said row of electronic components are produced in redundant form, together with the corresponding control circuits, each redundant subassembly thus being formed from the said row of components and its control circuits.

According to another feature, for each column of electronic components of the matrix, the interconnection lines of the electronic components of said column of electronic components and the corresponding control circuits are produced in redundant, each redundant subassembly then being formed by the said column of components and its control circuits.

According to another feature, when m is equal to 2p and n is equal to 2q, p and q corresponding to the minimum number of rows and columns necessary for the intended use of the matrix of electronic components and when a row or column of the matrix is detected as being defective, the reconstitution of the matrix of electronic components is carried out by connecting the electronic components of the defective row or column to the corresponding electronic components of the respectively adJacent rows or columns.

According to another feature, the operation of each electronic component is tested by means of optical addressing, which consists of transmitting light rays onto a photodiode associated with each electronic component.

According to another feature, the reconstitution of the matrix takes place by means of active components included in the control circuit.

According to another feature, the reconstitution of the matrix at the control circuit takes place by means of passive reconnections, following the destruction of the undesirable connections.

According to another feature, the matrix of electronic components is a matrix of transistors making it possible to control a matrix display.

According to another feature, the control circuits comprising registers are produced in such a way that the registers can be addressed during the test by light means using addressing photodiodes connected to the register points and during the test, by illuminating the said photodiode, the register point is switched to 1, which connects the interconnection line between the corresponding electronic components to a test output.

According to another feature, a second photodiode is provided at the other end of the interconnected line and a light ray is applied to said other photodiode, which produces a current in the interconnection line, which is observed on the test output if the line is not broken or interrupted.

According to another feature, as a function of the test result on the lines, the interconnection of the connections between the registers recognised as defective of each subassembly is interrupted by means of switches, the inputs of said unused registers being kept at zero, the satisfactory registers of each subassembly being connected to the satisfactory registers of the following subassembly.

According to another feature, the state of the switches associated with each interconnection is determined by interrupting or not interrupting the connection between a selection line and the switches of one subassembly, which makes it possible for the switches to return to a position imposed by a polarization.

According to another feature, the reconstitution of the matrix at the redundant registers is carried out by means of passive interconnections between the registers of each subassembly and the corresponding registers in the following subassemblies and wherein as a function of the test result, the defective registers are disconnected and the satisfactory redundant registers of each subassembly are connected to the satisfactory registers of the following subassembly, if this has not already been done, by means of connections between them.

According to another feature, the redundancy of the different elements of the subassembly is a redundancy of 2.

According to another feature, the redundancy of the different elements of the subassembly is a redundancy exceeding 2.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

FIGS. 2a to 2e, diagrammatically show several embodiments of the redundancies and at the pixels and their control transistors.

Figure 1A:
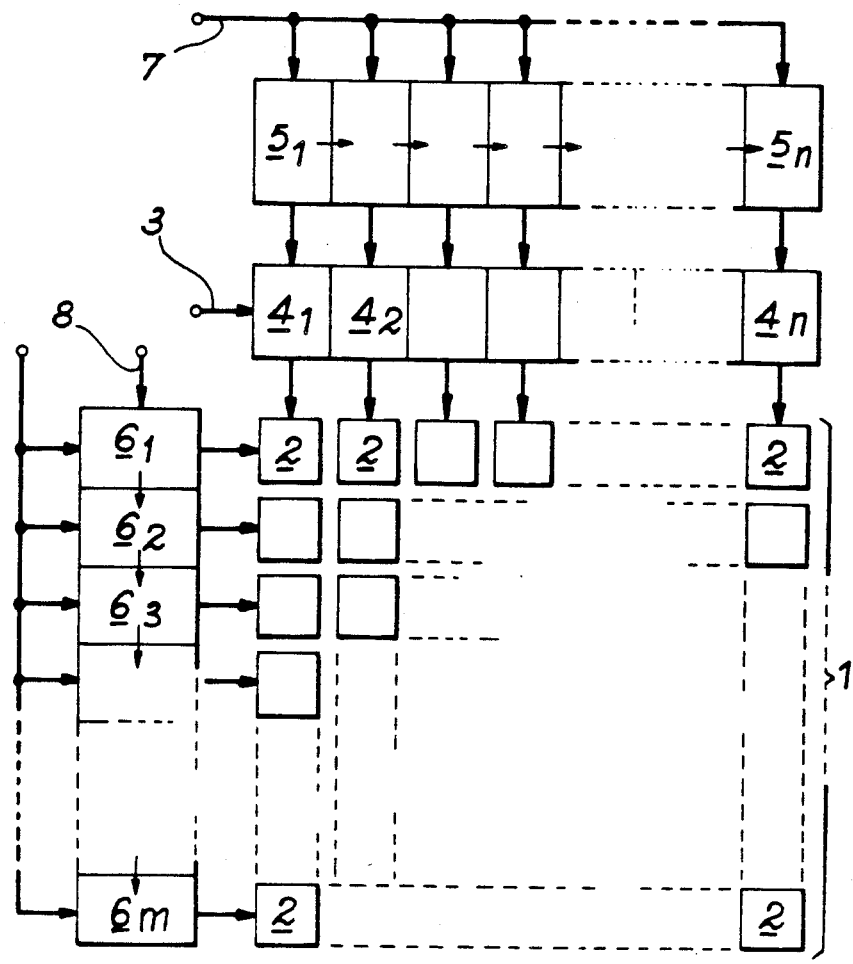
FIG. 1a, already described, diagrammatically and in simplified form the organisation of a matrix display.
Figure 1B:
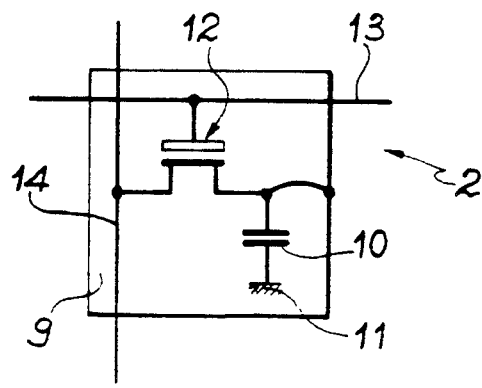
FIG. 1b, already described, diagrammatically an electrode of a liquid crystal display with its control transistor, connected to the corresponding column and row of the matrix.
Figure 2:
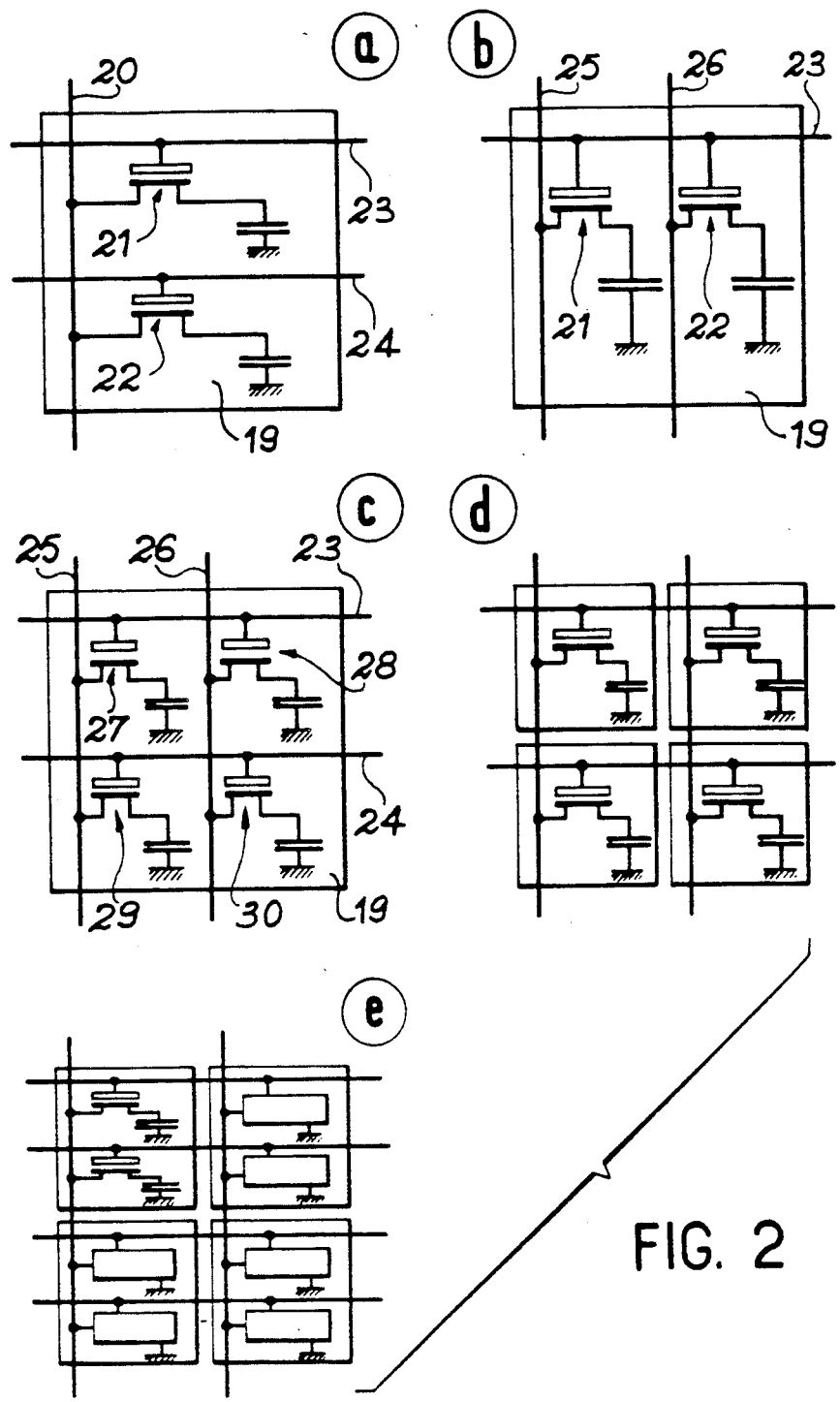
FIGS. 2a-2e diagrammatically, several embodiments of the redundancies at the elementary display points, pixels and their control transistors.

FIG. 2a shows an electrode 19 of a pixel, controlled by two control transistors 21, 22. In this case, the redundancy takes place at the rows of pixels of the display.

The sources of each transistor 21 and 22 are connected to electrode 19, the drains are connected to the common interconnection line 20 forming the connection between all the pixels of a matrix column and the grids of each transistor are in each connected to an interconnection line 23, 24 respectively between the rows of pixels of the matrix. The redundancy in this case is realised by two interconnection lines 23, 24 between the pixels of a matrix row and by the two control transistors 21, 22 for each pixel.

If one of the interconnection lines 23 or 24 between the rows of pixels of the matrix is defective, i.e. is for example broken, use is made of the other redundant example interconnection line. The probability that both interconnection lines 23 and 24 will be defective is proportional to the square of the probability of one of these two lines being defective.

In an illustrative manner, if the probability of a defect or fault in an interconnection line 23 or 24 is equal to 0.1, the probability that both redundant interconnection lines will be defective drops to 0.01%. The reliability of this interconnection is therefore considerably increased due to the redundancy.

FIG. 2b shows a second variant of the redundancy at the control transistors of each pixel. In this case, the redundancy is at the columns of pixels of the display. The grids of the two transistors controlling an electrode of a pixel are connected to a common interconnection line 23 connecting the pixels of one row of the matrix. The drains of each transistor 21, 22 are in each case connected to separate interconnection lines 25, 26 interconnecting the pixels of one matrix column.

The redundancy at the interconnection lines between the rows of pixels and between the columns of pixels of the matrix can be combined, as is shown in FIG. 2c. In this case, one pixel electrode is controlled by four transistors 27, 28, 29, 30.

In another variant, shown in FIG. 2d, the redundancy is at each pixel. As is shown, instead of 4 transistors controlling a pixel, it is also possible to subdivide the electrode into 4 separate electrodes, each being controlled by a transistor. In this case, the dimensions of these 4 electrodes are chosen in such a way that they occupy the same space in the matrix as one electrode in the preceding cases.

Thus, the number of matrix pixels is quadrupled. The number of registers for controlling the video sampling and rows or lines is increased in an adequate manner, the resolution of the image reproduced on the matrix consequently being increased.

Accepting that the resolution is improved by a factor of 2, on the complete screen, i.e. twice as good as necessary for achieving the initial objective, the fact that one row or column in the matrix is defective does not cause disturbing problems, provided that the pixels of a defective column or row are connected to the corresponding pixels on a respectively adjacent column or row.

The latter condition is necessary, because the failure of a row or column leads to a white or black row or column on the screen, which remains visible, even if the naked eye cannot resolve each elementary display point. By connecting the pixels of the defective row or column to the corresponding pixels of the preceding row or column and the following row and column in an alternate manner, resolution is locally brought to a definition twice less good than on the remainder of the matrix, but no defective row or column is visible on the display screen.

In this case, it is obviously possible to introduce a redundancy at the interconnection lines in a manner described hereinbefore. For example, FIG. 2e shows the combination of the redundancy at the electrodes of pixels with a redundancy of 2 at the interconnection lines between each row of pixels.

The interconnection lines between the rows and columns of pixels are connected to their control circuits at the periphery of the matrix, i.e. to the register points, power supply, clock, etc.

According to the invention, these control circuits are also in redundancy. Thus, for two redundant interconnection lines, there are also two register points, connected to each of the interconnection lines. The redundant functions, i.e. the interconnection lines between the rows or columns of the pixels and their associated control circuits must be individually accessible for an operational test without introducing a large number of access hubs, preference being given to a common series output.

For testing purposes, it is necessary to subdivide the matrix into redundant subassemblies and test each subassembly separately. If the subassemblies are too large, the efficiency becomes too low despite the redundancy, whilst if the subassemblies are too small, the overall improvement is reduced by the reconfiguration. By choosing rows and columns of redundant pixels having a complexity of approximately 500 to 1000 control transistors with their control circuits in the form of subassemblies, the optimum is approximately reached. The thus obtained subassemblies have the advantage of being accessible at the matrix periphery, which facilitates testing and reconfiguration.

Figure 3A:
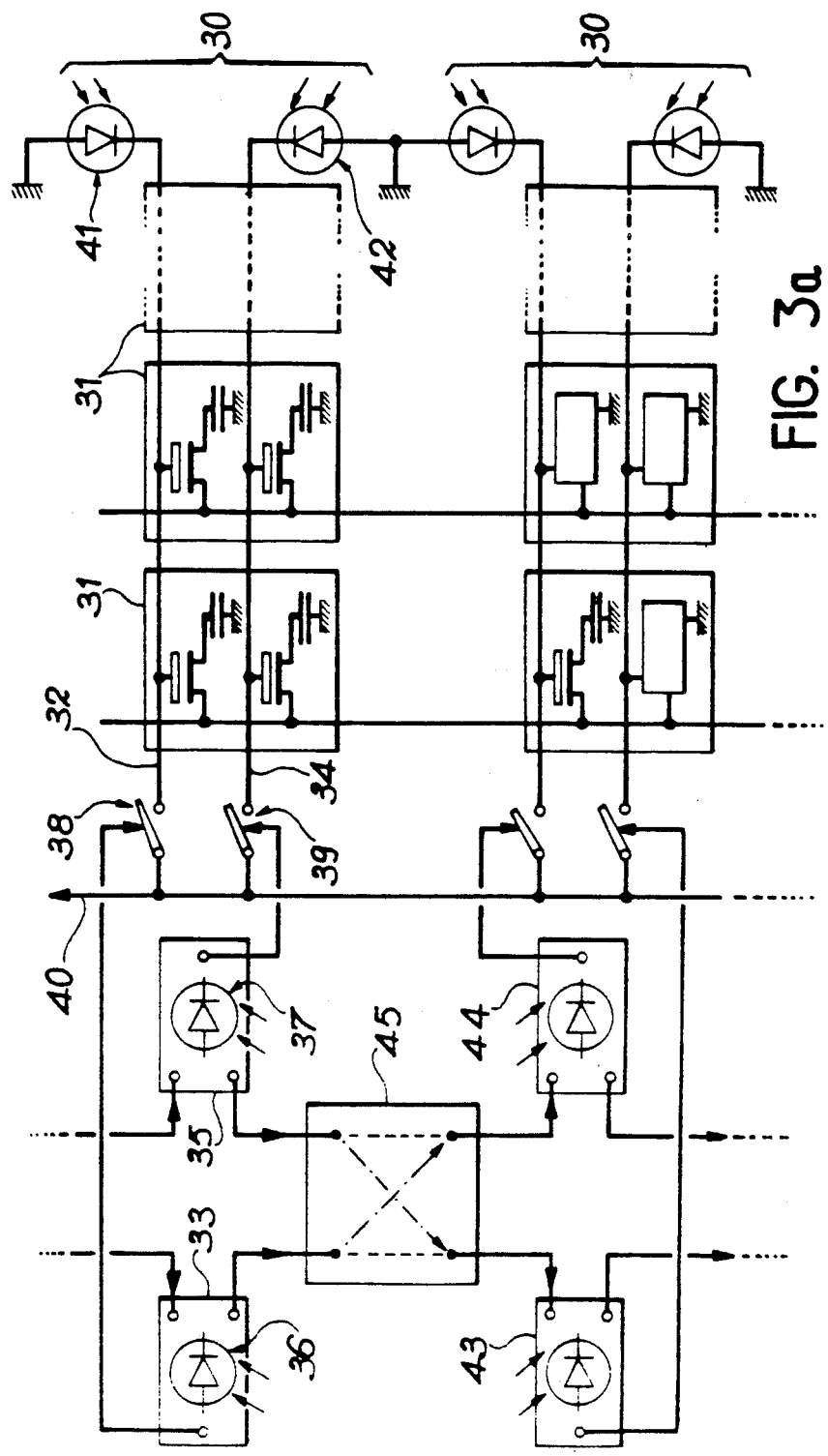
FIG. 3a diagrammatically, an example of a redundant matrix, where the interconnection lines between the pixels and their control circuits are in redundancy with the test arrangements, incorporating photodiodes.

FIG. 3a shows two redundant subassemblies. Each subassembly 30 is constituted by a row of pixels 31, their interconnection lines 32, 34 in a redundancy of 2, as well as by register points 33, 35, each associated with the corresponding interconnection lines 32, 34 respectively.

Each register point 33, 35 respectively comprises a photodiode 36, 37 which permits, by optical addressing by means of a light beam, to switch to one the register point 33 or 35, whilst all the other points of the matrix registers are kept at zero. The 1 in register 33, 35 respectively connects the corresponding line 32, 34 to the test output 40 by means of a switch 38, 39 respectively.

A second photodiode functioning as a photovoltaic cell 41, 42 respectively is placed at the end of each interconnection line 32, 34. During the test, said photodiode receives a light beam and consequently produces a current in the interconnection line, which will be observed on the test output if said interconnection line is not interrupted or broken. It is advantageous to use a pulsed optical signal in order to be able to separate the background noise from the electrical signal produced in this way in the interconnection lines and observed at the test output. In other words, the pulsed light beam creates a distinctive electrical signal that may be easily separated from background noise. The interconnection lines of the columns are kept at earth during the test.

This test procedure utilizing optical addressing makes it possible to test the different subassemblies of the matrix, without a defective element prejudicing the testing of the other subassemblies.

Thus, testing takes place of the retention or maintenance of one or 0 in the register points, the continuity of the interconnection lines and the absence of short-circuits on the interconnection lines.

By transferring the 1 from a register point 33, 35 of a subassembly to a register 43, 44 of the following subassembly, it is possible to test the connections between the register points forming future reconnections, which consequently benefit from the redundancy and clock or timing lines and the switches controlled by them.

In the case when it is wished to have a fault-free matrix, it is necessary to test each pixel individually and correct it if necessary. For this purpose, it is necessary to introduce a photodiode into each pixel. It must be relatively large in order to be able to receive a light beam during the test by means of optical addressing.

Figure 3B:
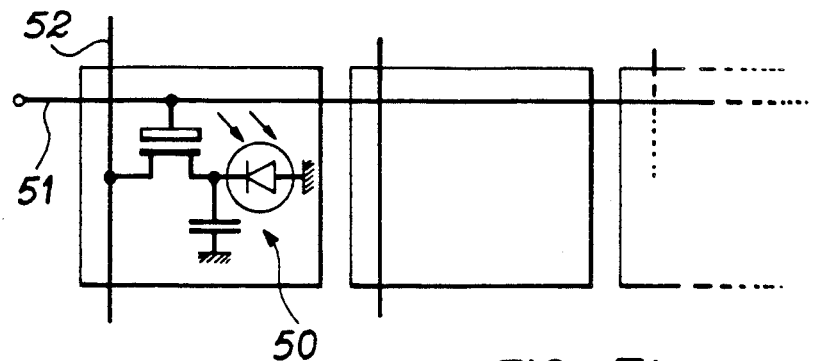
FIG. 3b diagrammatically, an electrode of a liquid crystal matrix display, the control transistor being individually testable by means of a photodiode included in the pixel.

FIG. 3b shows a pixel comprising a photodiode 50, which is connected between earth and the pixel control electrode.

The interconnection line 51 between the pixels of a row of the matrix being connected to earth, so that the test signal produced by the illuminated photodiode 50 exits via the interconnection line 52 between the pixels of a matrix pixel column. This column 52 is connected to a corresponding register point. An optical addressing on the photodiode 50 on this register point connects line 52 to the test output. As a function of the test result, the defective pixels are reconnected either to the same redundant interconnection line, or to the adjacent line if there is no line redundancy.

The reconstitution of the matrix as a function of the results of the tests carried out on the subassemblies or on the pixels individually, can be directly carried out during or after the test. In the latter case, the test results are stored and reconfiguration takes place in a separate process.

In the following text, a description is given of the reconfiguration process of a subassembly constituted by a row of pixels, whose interconnection lines and associated control circuits are produced with a redundancy of 2, as shown in FIG. 3a.

If, for example, the test of interconnection line 34 has shown that it is defective, all the control transistors of all the pixels of the row connected to interconnection line 34 are disconnected. The disconnections can be also carried out according to conventional etching procedures in CMOS technology. Thus, it is possible to ensure that a possibly defective control transistor cannot bring about disturbances at the columns. This is followed by the disconnection of register point 35 associated with said interconnection line 34 from the registers of the preceding and following pixel rows.

According to the invention, at the connections between the register points, two fundamentally different interconnection circuits 45 can be envisaged. The connections can already be produced between the register points of each row of pixels arranged in superimposed manner, i.e. the register points 35 and 44 are connected, as well as register points 33 and 43 and so on, which gives two parallel registers.

As a function of the test result, if a register point or a corresponding interconnection line between the pixels is defective, the connections between this register and the preceding and succeeding registers are interrupted and a modified connection is produced by replacing said defective register point by the redundant register point associated with the same row of pixels and by reforming the connection between the preceding and succeeding register points.

This reconnection by means of so-called passive reconnection circuits is shown in FIGS. 4a to 4d.

Figure 4A:
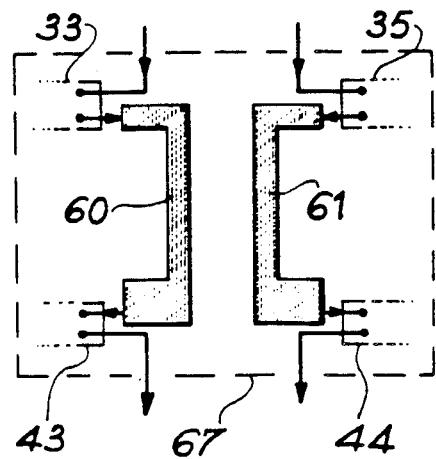
FIGS. 4a to 4c diagrammatically, the various stages of producing passive connections between the satisfactory register points.
Figure 4B:
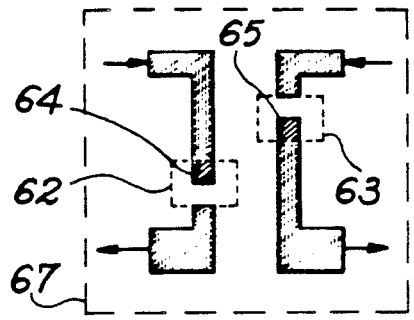
Figure 4C:
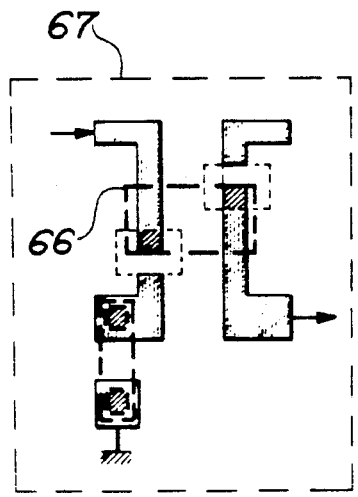

FIG. 4a shows that the register points 33, 43 and register points 35, 44 are interconnected by means of aluminium connections, e.g. 60, 61 respectively. If during the test, register point 43 is found to be defective, firstly two holes 62, 63 are made in the oxide layer 67 covering the aluminium lines, as shown in FIG. 4b. Thus, these regions of the aluminium connections have been bared.

An aluminium hub 66 is then deposited on these two contact holes in insulant 67, in order to produce the contact between register points 33, 43 and simultaneously interrupt the connections 60, 61, so that a portion 64, 65 of said connections is left and can be connected to the parts of the aluminium lines which are to form the future connection. Instead of interrupting line 61 connecting the satisfactory register points 35, 44, it is possible to leave them connected. In this case, use is also made of the redundancy after the test, i.e. during the permanent use of the matrix. This has certain advantages. In particular, it reduces the number of modification operations relative to the connections between successive register points. If there is no fault in a subassembly, all the associated register points are kept in operation.

Figure 4D:
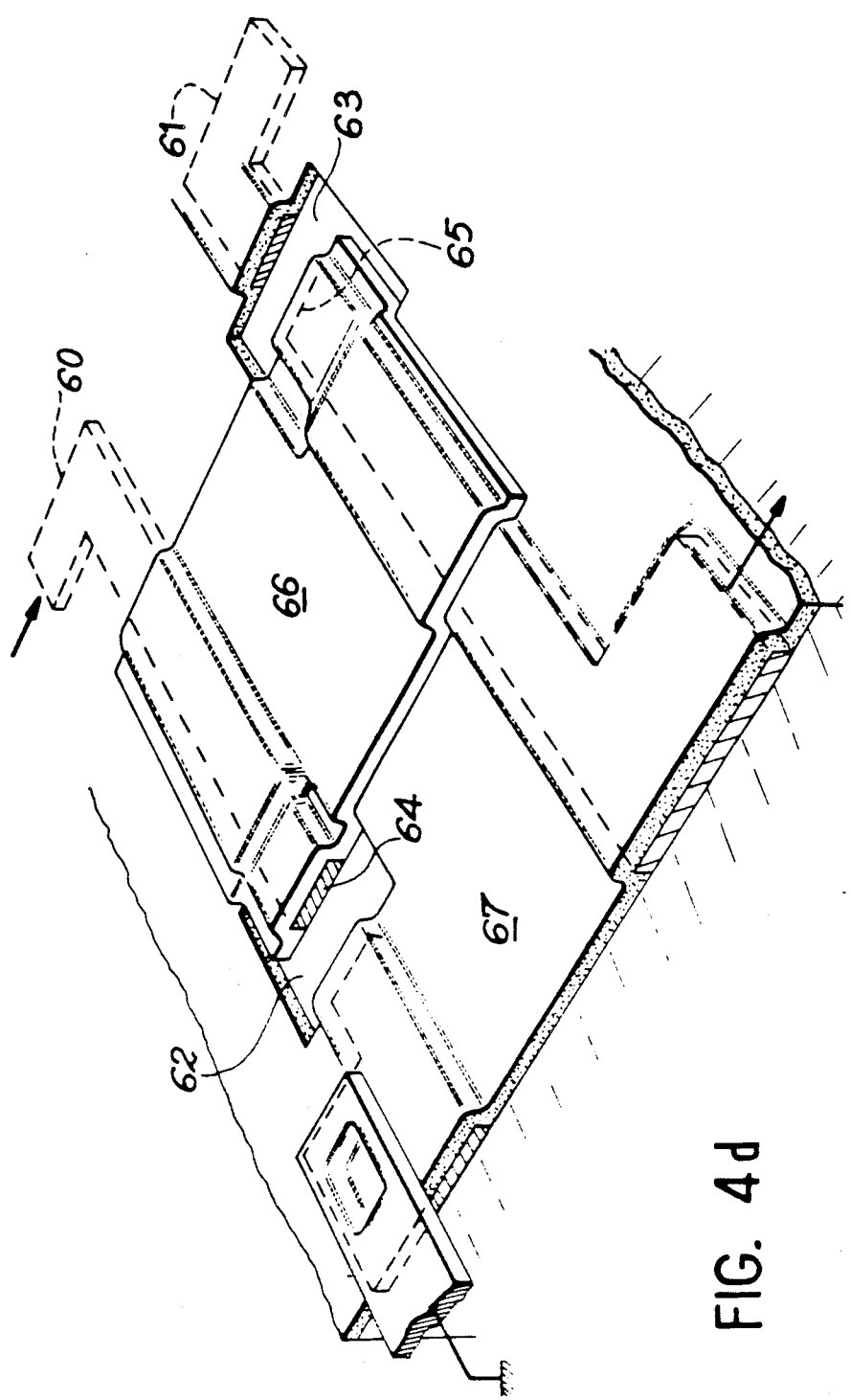
FIG. 4d diagrammatically and in perspective form, an example of a connection obtained.

In a final stage, the input of the unused defective register point 43 is connected to earth, in order to define its potential. The process of providing this connection to earth takes place in the same way as described hereinbefore. FIG. 4d shows in perspective the thus obtained connection.

As a result of the process described hereinbefore, it is then possible to interrupt or produce a connection between successive register points. In this case, the reconfiguration circuit of the connections between the registers can have a very small surface area (size of one contact), but it is not possible to test different function associations during the test.

Figure 5:
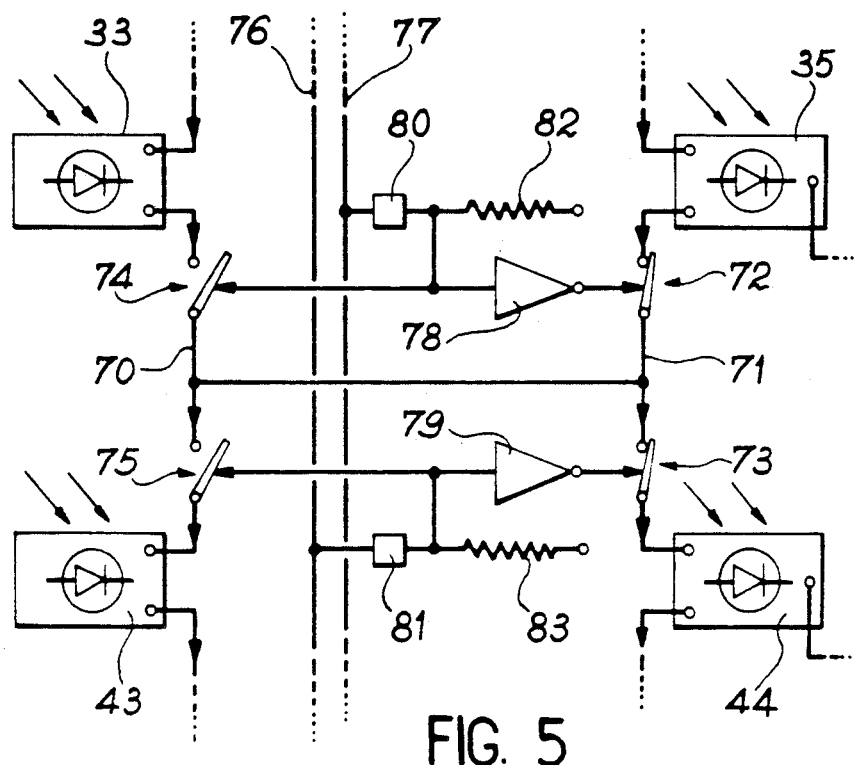
FIG. 5 diagrammatically, a circuit of active components making it possible to choose during the test the connection between the satisfactory register points.

In an active reconfiguration, an electronic circuit controlled from the outside produces various connections between the functions during the test. The electronic reconfiguration circuit is tested in the same way as the other functions and consequently benefits from the redundancy. FIG. 5 shows an example of an active reconnection.

In FIG. 5, a reconfiguration circuit between four register points 33, 35, 43, 44 comprises four switches 72, 73, 74, 75. The switches can be produced by means of CMOS transistors. The output of register point 33 is connected to the input of register point 43 by means of a line 70 having two switches 74, 75. In the same way, the output of register point 75 is connected to the input of register point 44 by means of a line 71 having two switches 72, 73. The two lines 70 and 71 are interconnected by means of an aluminium line, their contact points being located between the two switches of each line 70, 71.

Two switches 74, 72 or 75, 73, such as transistors, each on a line 70 or 71 are controlled by complementary signals from selection lines 76, 77. For example, selection line 77 is directly connected to switch 74 and via an inverter 78 to switch 72. A pulling resistor 82 makes it possible to define the so-called standard state of the two associated switches e.g. 74, 72, i.e. the opening or closing of switch 74 and conversely the opening or closing of switch 72. This standard state can be inverted by a signal opposite to that of the pulling signal on selection line 77. For example, in earth pulling, a voltage produced in selection line 77 closes switch 74 and opens switch 72. If there is no voltage on the selection line, the signal from the pulling resistor 82 reverses the states of switches 74, 72, i.e. switch 74 is open and switch 72 closed.

Switches 75 and 73 are connected in an identical manner to selection line 76. The associated pulling resistor is 83 and the associated inverter 79. With the four possible combinations of signals in the selection lines, i.e. signal on line 76, signal on line 77 or signal on line 76, no signal on line 77 or no signal on line 76, signal on line 77 or no signal on line 76, no signal on line 77, it is possible to test the four possible connections between the successive register points. In order to definitively choose the electrical path between the successive register points, it is possible to interrupt or not interrupt the connections between the selection lines 76 or 77 respectively and switches 74, 72 or 75, 73 respectively. If the said connection is interrupted at a predetermined location 80, 81, the switches are solely controlled by the pulling resistors.

Hitherto, a description has been given of the production process of a matrix of electronic components with a redundancy of 2 at the interconnection lines, as well as the associated control circuits, together with the case of a redundancy of 2 at the electronic components.

It is also possible to increase the redundancy in both these cases by providing at least three interconnection lines between the components or by choosing a resolution at least three times higher than necessary, in order to achieve even greater reliability. However, an increase in the redundancy implies an increase in the overall dimensions of the matrix, as well as an increase in the number of testing and reconfiguration stages, which can lead to a drop in efficiency. Nevertheless, redundancies exceeding 2 can be envisaged.

The overall dimensions of the control circuits comprising resister points, memories, clocks, etc. already causes certain problems in the case of a redundancy of 2.

According to the invention, the control circuits of the columns of pixels 92 are located in alternating manner above and below the matrix of pixels. In the same way, the control circuits of the rows of pixels 93 are arranged in an alternating manner to the right and left of the matrix.

Figure 6:
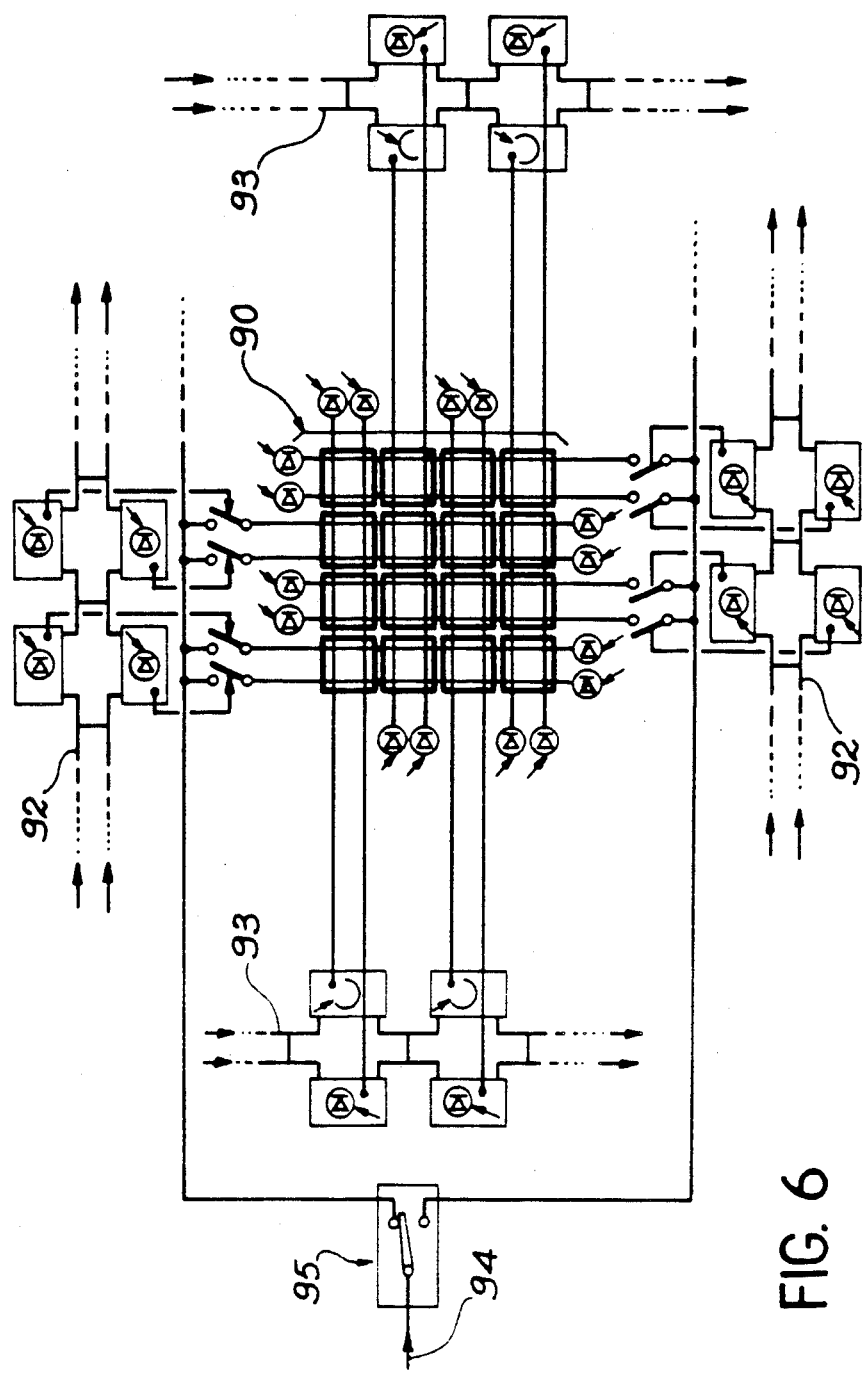
FIG. 6 diagrammatically, the organisation of a matrix of a liquid crystal display and the arrangement of its control circuits at the periphery.

FIG. 6 diagrammatically shows the organisation of a matrix 90 of pixels of a liquid crystal display and the arrangement of these control circuits 92, 93 on the periphery. The circuits located on the same side of the matrix are interconnected. The sampling of the video signal 94 and the clocks are adapted to this configuration by means of switches 95.

What is claimed is:

1. A process for the production of a matrix of electronic components having m rows and n columns of electronic components and control circuits located at the periphery of the matrix, associated with each row and each column of components, wherein it comprises providing the matrix and the associated control circuits in redundant form, the redundant elements being subassemblies each constituted by a certain number of electronic components associated with their control circuits, each subassembly being provided in such a way that it can be tested at the matrix perihery; performing the test of each sub-assembly by means of optical addressing consisting of transmitting light rays onto first photodiodes and second photodiodes having grounded anodes so as to function as photovoltaic cells, the diodes being located at the matrix periphery and connected to each subassembly, said first photodiodes being used for selecting the subassemblies to be tested and said second photodiodes with grounded anodes being used to produce test signals by means of pulsed light rays in the same subassembly, each of said second photodiodes, in response to said pulsed light rays, generating and creating a distinctive voltage signal constituting one of said test signals applied to the subassembly to be tested, said test being used to check, in each redundant subassembly, the continuity of the interconnection lines between the electronic components and the operation of the associated control circuit; reconstituting the matrix, as a function of the test result, by disconnecting within the redundant subassemblies the defective electronic components; and reconnecting the satisfactory electronic components.

2. A process according to claim 1, wherein for each row of electronic components of the matrix, the interconnection lines of electronic components of said row of electronic components are produced in redundant form, together with the corresponding control circuits, each redundant subassembly thus being formed from the said row of components and its control circuits.

3. A process according to claim 1, wherein for each column of electronic components of the matrix, the interconnection lines of the electronic components of said column of electronic components and the corresponding control circuits are produced in redundant, each redundant subassembly then being formed by the said column of components and its control circuits.

4. A process according to claim 1, wherein when m is equal to 2p and n is equal to 2q, p and q corresponding to the minimum number of rows and columns necessary for the intended use of the matrix of electronic components and when a row or column of the matrix is detected as being defective, the reconstitution of the matrix of electronic components is carried out by connecting the electronic components of the defective row or column to the corresponding electronic components of the respectively adjacent rows or columns.

5. A process according to claim 4, wherein the said reconstitution is carried out by connecting the components of the defective row or column to the corresponding components of the preceding row or column and the succeeding row or column in an alternating manner.

6. A process according to claim 1, wherein the operation of each electronic component is tested by means of optical addressing consisting of transmitting light rays onto a photodiode associated with each electronic component.

7. A process according to claim 1, wherein the reconstitution of the matrix at the control circuits takes place by means of passive reconnections after destroying the undesirable connections.

8. A process according to claim 1, wherein the reconstitution of the matrix takes place by means of active components included in the control circuit.

9. A process according to claim 7, wherein the reconstitution of the matrix takes place during the testing of the subassemblies of electronic components.

10. A process according to claim 8, wherein the reconstitution of the matrix takes place after testing the subassemblies of the electronic components.

11. A process according to claim 1, wherein the matrix of electronic components is a matrix of transistors making it possible to control a matrix display.

12. A process according to claim 11, wherein the control circuits comprising registers are produced in such a way that the registers can be addressed during the test by light means using addressing photodiodes connected to the register points and during the test, by illuminating the said photodiode, the register point is switched to 1, which connects the interconnection line between the corresponding electronic components to a test output.

13. A process according to claim 12, wherein a second photodiode is provided at the other end of the interconnection line and a light ray is applied to said photodiode, which produces a current in the interconnection line which is observed at the test output if the line is not broken.

14. A process according to claim 13, wherein the light ray applied to the photodiode is pulsed.

15. A process according to claim 12, wherein the reconstitution of the matrix at the redundant registers takes place by means of interconnections connecting each register of a redundant subassembly to each register of the following subassembly, the interconnections incorporating switches controlled by an external electronic circuit, which produces the different connections between the registers during the test.

16. A process according to claim 15, wherein as a function of the test result on the lines, the interconnection of the connections between the registers recognised as defective of each subassembly is interrupted by means of switches, the inputs of said unused registers being kept at zero, the satisfactory registers of each subassembly being connected to the satisfactory registers of the following subassembly.

17. A process according to claim 15, wherein the switches are CMOS transistors.

18. A process according to claim 15, wherein the state of the switches associated with each connection is determined by interrupting or not interrupting the connection between a selection line and the switches of a subassembly, which makes it possible for the switches to return to a position imposed by a polarization.

19. A process according to claim 11, wherein the reconstitution of the matrix at the redundant registers is carried out by means of passive interconnections between the registers of each subassembly and the corresponding registers in the following subassemblies and wherein as a function of the test result, the defective registers are disconnected and the satisfactory redundant registers of each subassembly are connected to the satisfactory registers of the following subassembly, if this has not already been done, by means of connections between them.

20. A process according to claim 19, wherein a connection is produced between the interconnection lines of the defective registers and earth, in order to define the potential at the input of the unused registers.

21. A process according to claim 15, wherein the test results are stored and the reconstitution of the matrix takes place after the test.

22. A process according to claim 1, wherein the redundancy of the different elements of a subassembly is a redundancy of 2.

23. A process according to claim 1, wherein the redundancy of the different elements of a subassembly is a redundancy higher than 2.

24. A process according to claim 11, wherein the arrangement of the control circuits of the columns of pixels is chosen in an alternating manner above andlelow the matrix of pixels, the control circuits of the rows of pixels being positioned in an alternating manner to the right and left of the matrix, the circuit located on the same side of the matrix being interconnected, the sampling of the video signal and the clocks being adapted to said configuration by means of switches.

* * * * *